United States Patent
Jang et al.

(10) Patent No.: US 11,355,479 B2
(45) Date of Patent: Jun. 7, 2022

(54) DISPLAY COMPRISING LIGHT-EMITTING CHIPS AND MANUFACTURING METHOD THEREFOR

(71) Applicant: Samsung Electronics Co., Ltd., Suwon-si (KR)

(72) Inventors: Kyung Woon Jang, Seoul (KR); Hyun-Tae Jang, Seoul (KR); Youngjun Moon, Hwaseong-si (KR); Changjoon Lee, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 16/650,578

(22) PCT Filed: Jul. 17, 2018

(86) PCT No.: PCT/KR2018/008055
§ 371 (c)(1),
(2) Date: Mar. 25, 2020

(87) PCT Pub. No.: WO2019/066223
PCT Pub. Date: Apr. 4, 2019

(65) Prior Publication Data
US 2020/0235078 A1 Jul. 23, 2020

(30) Foreign Application Priority Data

Sep. 26, 2017 (KR) .......................... 10-2017-0124391

(51) Int. Cl.
*H01L 25/075* (2006.01)
*H01L 27/12* (2006.01)
(Continued)

(52) U.S. Cl.
CPC ...... *H01L 25/0753* (2013.01); *H01L 27/1214* (2013.01); *H01L 33/24* (2013.01);
(Continued)

(58) Field of Classification Search
CPC . H01L 25/0753; H01L 27/1214; H01L 33/24; H01L 33/62; H01L 2933/0033; H01L 2933/0066
See application file for complete search history.

(56) References Cited

U.S. PATENT DOCUMENTS 11,081,471 B2 * 8/2021 Shimizu ................ H01L 33/501
2005/0218468 A1 * 10/2005 Owen ..................... H01L 33/60
257/433
(Continued)

FOREIGN PATENT DOCUMENTS

KR 10-2002-0035819 5/2002
KR 10-1607305 3/2016
(Continued)

OTHER PUBLICATIONS

International Search Report for PCT/KR2018/008055 dated Oct. 25, 2018, 5 pages.
(Continued)

*Primary Examiner* — Victor A Mandala
(74) *Attorney, Agent, or Firm* — Nixon & Vanderhye, P.C.

(57) ABSTRACT

A display according to one embodiment of the present invention comprises: a light-transmitting first layer and including a plurality of cavities; a plurality of light-emitting diode (LED) chips disposed in the cavities; and a second layer including a circuit electrically connected to the plurality of LED chips. Various other embodiments are also possible.

15 Claims, 19 Drawing Sheets

(51) Int. Cl.
*H01L 33/24* (2010.01)
*H01L 33/62* (2010.01)

(52) U.S. Cl.
CPC ...... *H01L 33/62* (2013.01); *H01L 2933/0033* (2013.01); *H01L 2933/0066* (2013.01)

(56) References Cited

U.S. PATENT DOCUMENTS

| | | | |
|---|---|---|---|
| 2011/0193105 A1* | 8/2011 | Lerman | F21K 9/20 257/88 |
| 2013/0037830 A1* | 2/2013 | Jang | H01L 33/60 257/88 |
| 2013/0187174 A1* | 7/2013 | Tischler | H05B 33/12 257/80 |
| 2015/0303360 A1* | 10/2015 | Yoo | H01L 33/60 257/98 |
| 2015/0371975 A1* | 12/2015 | Shimizu | H01L 33/505 257/88 |
| 2016/0197232 A1 | 7/2016 | Bour et al. | |
| 2016/0293566 A1 | 10/2016 | Golda et al. | |
| 2016/0380158 A1 | 12/2016 | Sasaki et al. | |
| 2017/0018613 A1 | 1/2017 | Bibl et al. | |
| 2017/0034916 A1 | 2/2017 | Yamagami et al. | |
| 2017/0148771 A1 | 5/2017 | Cha et al. | |
| 2017/0229430 A1* | 8/2017 | Lai | H01L 25/0753 |
| 2018/0294254 A1* | 10/2018 | Chen | G02B 19/0019 |
| 2018/0374996 A1* | 12/2018 | Singer | H01L 33/486 |
| 2020/0168498 A1* | 5/2020 | Marinov | H01L 21/67115 |
| 2020/0227394 A1* | 7/2020 | Yeh | H01L 24/73 |

FOREIGN PATENT DOCUMENTS

| | | |
|---|---|---|
| KR | 10-1636516 | 7/2016 |
| KR | 10-2017-0059068 | 5/2017 |
| KR | 10-2017-0061921 | 6/2017 |
| KR | 10-2017-0100611 | 9/2017 |
| WO | WO 2017/081184 * | 5/2017 |

OTHER PUBLICATIONS

Written Opinion of the ISA for PCT/KR2018/008055 dated Oct. 25, 2018, 5 pages.

Notice of Preliminary Rejection dated Nov. 3, 2021 in Korean Patent Application No. 10-2017-0124391 and English-language translation.

\* cited by examiner

DISPLAY COMPRISING LIGHT-EMITTING CHIPS AND MANUFACTURING METHOD THEREFOR

This application is the U.S. national phase of International Application No. PCT/KR2018/008055 filed Jul. 17, 2018 which designated the U.S. and claims priority to KR Patent Application No. 10-2017-0124391 filed Sep. 26, 2017, the entire contents of each of which are hereby incorporated by reference.

TECHNICAL FIELD

The disclosure relates to a display and a method for manufacturing the same, by which pixels are realized by using light-emitting chips.

DESCRIPTION OF RELATED ART

Display industries have continued to develop mainly in the fields of TVs, monitors, and mobile products. The manufacturers have built markets while developing characteristics, such as screen qualities and resolutions, which can appeal to users. As an effort to realize high resolution, high luminance, and low power, the paradigm for realizing displays by using light-emitting elements (or light-emitting chips) in unit of chips in the panel-based display industries based on existing liquid crystal displays (LCDs) or organic light-emitting diodes (OLEDs) has changed.

In recent years, micro LED (or mLED or μLED) that are ultra-mini LED chips have been designed. The micro LED chip may be utilized as one pixel that may emit light without any backlight when being applied to a display. If the micro LED chips are applied to a display, they may have high luminance, quick response speed, excellent contrast, high color reproduction rate, and long lifespan. Further, because the sizes and shapes of the panels are not restricted, it is expected that they will be applied to ultra-large displays of approximately 100 inches or more, including a small-sized display which are mounted on wearable devices and smartphones.

SUMMARY

Displays may be manufactured by mounting micro LED chips on circuit boards (e.g., PCBs) by using a technology (e.g., a surface mounting technology (SMT)) based on soldering. If the micro LED chips can be precisely mounted on pixel areas of a circuit board, yield rate can be enhanced. However, warpage or deformation may occur due to heat and pressure in a process of mounting the micro LED chips on the circuit board, which may deteriorate the yield rate of the display. Further, when the surface flatness of the mounting surface of the circuit board cannot be secured, it also may be difficult to secure the yield rate.

The disclosure may provide a display which includes light-emitting chips and is manufactured differently from a scheme of mounting a plurality of micro LED chips on a circuit board, and a method for manufacturing the same.

The disclosure also may provide a method for embedding a plurality of micro LED chips in a display promptly and precisely, and a display manufactured through the same.

In accordance with an aspect of the disclosure, a display may include: a first layer that is light-transmitting and includes a plurality of cavities; a plurality of light-emitting diode (LED) chips disposed in the cavities; and a second layer including a circuit electrically connected to the plurality of LED chips.

According to an embodiment, because a display is manufactured through packaging of a scheme of, after forming a plurality of cavities in a plate formed of a material, such as glass, having thermal resistance and disposing light-emitting chips such as micro LED chips in the cavities, forming a circuit layer, yield rate may be improved as compared with the conventional technology.

DETAILED DESCRIPTION OF EXAMPLE EMBODIMENTS

Figure 1:
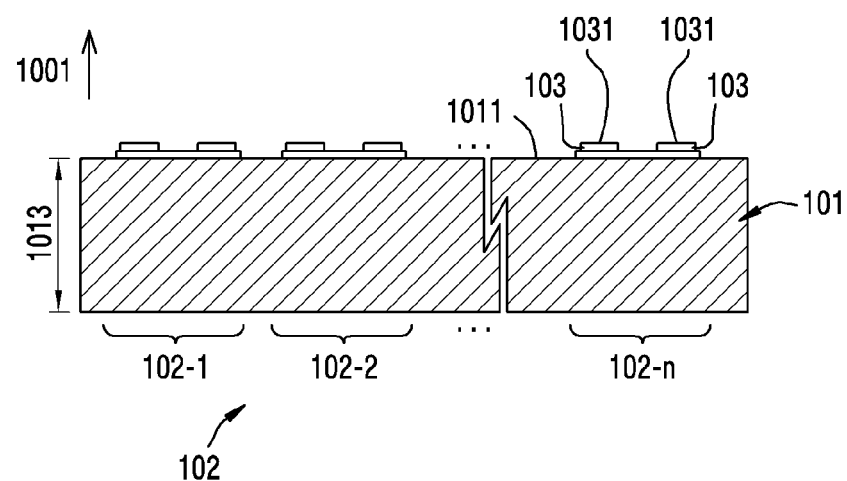
FIG. 1 is a cross-sectional view of a substrate, in which micro LED chips are disposed, according to an embodiment.

Hereinafter, various embodiments of the disclosure will be described with reference to the accompanying drawings. However, it should be appreciated that they are not intended to limit the disclosure to particular embodiments and include various changes, modifications, equivalents, and/or alternatives for a corresponding embodiment. With regard to the description of the drawings, similar reference signs may be used to refer to similar or related elements.

As used herein, the expression "have", "may have", "include", or "may include" indicates the existence of a corresponding feature and does not exclude the existence of additional features.

As used herein, the expression "A or B", "at least one of A and/or B", or "one of more of A and/or B" may include all possible combinations of items enumerated together. For example, "A or B", "at least one of A and B", or "at least one of A or B" may refer to all of (1) including at least one A, (2) including at least one B, or (3) including all of at least one A and at least one B.

The expressions "a first", "a second", "the first", "the second", and the like as used in various embodiments may modify various elements regardless of the order and/or the importance thereof, and does not limit the corresponding elements. These expressions may be used to distinguish between one element and any other element. For example, a first element may be termed a second element, and similarly, a second element may be termed a first element without departing from the scope of the disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it could be understood that when an element (e.g., first element) is referred to as being "directly connected," or "directly coupled" to another element (second element), there are no element (e.g., third element) interposed between them.

The expression "configured to" used in the disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., Central Processing Unit (CPU) or Application Processor (AP)) that can perform the corresponding operations by executing one or more software programs stored in a memory device.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

A display according to various embodiments of the disclosure may be applied to various electronic devices such as a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device (e.g., smart glasses, head-mounted device (HMD)), electronic clothing, electronic bracelet, electronic necklace, elecvtronic accessory (appcessory), electronic tattoo, smart mirror, or smart watch).

According to some embodiments, the display may be applied to smart home appliances such as a television, a digital video disk (DVD) player, an audio, a refrigerator, an air conditioner, a vacuum cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to other embodiments, the display may be applied to various medical devices (e.g., various portable medical measuring devices (blood glucose monitoring device, heart rate monitoring device, blood pressure measuring device, body temperature measuring device, etc.), Magnetic Resonance Angiography (MRA), Magnetic Resonance Imaging (MRI), Computed Tomography (CT) machine, ultrasonic machine, etc.), a navigation device, a Global Positioning System (GPS) receiver, an Event Data Recorder (EDR), a Flight Data Recorder (FDR), a vehicle infotainment device, electronic equipment for a ship (e.g., ship navigation device, gyro-compass, etc.), avionics, a security device, an automobile head unit, a home or industrial robot, an Automatic Teller's Machine (ATM) in banks, Point Of Sales (POS) in a shop, or Internet of things devices (e.g., light bulb, various sensors, electric or gas meter, sprinkler device, fire alarm, thermostat, streetlamp, toaster, sporting goods, hot water tank, heater, boiler, etc.).

According to some embodiments, the display may be applied to a part of furniture or a building/structure, an electronic board, an electronic signature receiving device, a projector, and various kinds of measuring instruments (e.g., water meter, electric meter, gas meter, radio wave meter, etc.).

According to some embodiments, the display may be applied to a project, a cinema screen, and the like.

The display according to embodiments of the disclosure is not limited to the aforementioned devices, and may be applied to new devices according to the development of technology.

Hereinafter, a display including micro LED chips (or elements) and a method for manufacturing the same according to various embodiments of the disclosure will be described with reference to the accompanying drawings.

A micro LED chip is a semiconductor device including two electrodes (hereinafter, diodes) and an N type material and a P type material in the diodes, and may be designed to have various structures based on the semiconductor device. The micro LED chip may convert electric energy into light energy, and may output light of various wavelengths according to the kinds of the materials used in a semiconductor.

The shape or size of micro LED chips of a display according to various embodiments is not limited. According to an embodiment, a micro LED chip is a hexahedron having a width, a depth, and a height, and may be defined by an LED chip designed such that the width, the depth, and the height thereof is substantially not more than 200 µm. In some embodiments, a micro LED chip may be defined by an LED chip designed to have a volume of substantially nor more than 200×200×200 µm$^3$. In some embodiments, the width, the depth, and the height of one of the micro LED chips may be designed to not more than 100 µm. For example, the width and the depth of a micro LED chip applied to a short distance display, such as a TV, a monitor, a smartphone, or a watch, may be approximately 5 µm×5 µm, and a micro LED chip applied to a long distance display, such as a display of a movie theater, may have a size that is the same as or larger than the size of a micro LED chip applied to a short distance display. All the shapes or sizes of the micro LED chips cannot be listed, but they may be variously modified according to a convergence trend.

FIG. 1 is a cross-sectional view of a substrate, in which micro LED chips are disposed, according to an embodiment.

Referring to FIG. 1, in an embodiment, substrate based micro LED chips 102 may be disposed. A substrate 101 is a thin plate that is a base for manufacturing a semiconductor device, and if the substrate 101 undergoes a process of coupling a diode and the like to one surface 1011 of the substrate 101 by using deposition and the like, the substrate 101, in which a plurality of micro LED chips 102 are disposed, may be formed. The substrate 101 may include a material formed of a single chemical element or a material formed of two or more elements. The thickness 1013 of the substrate 101 may be designed in consideration of a final micro LED chip (102-n), and for example, may be substantially not more than 500 µm. The substrate 101 may have the shape of a circular wafer. In some embodiments, the substrate 101 may have the shape of a rectangular panel.

According to an embodiment, if the substrate 101 is cut, the plurality of micro LED chips 102 may be separated. A micro LED chip 102-n may include contacts 103 that provide contact surfaces 1031, which faces a direction 1001, which one surface 1011 of the substrate 101 faces. If the micro LED chip 102-n is applied to the display and current is supplied from the driving circuit or the driving element to the contact surfaces 1031, the micro LED chip 102-n may output light of a corresponding color.

Figure 2:
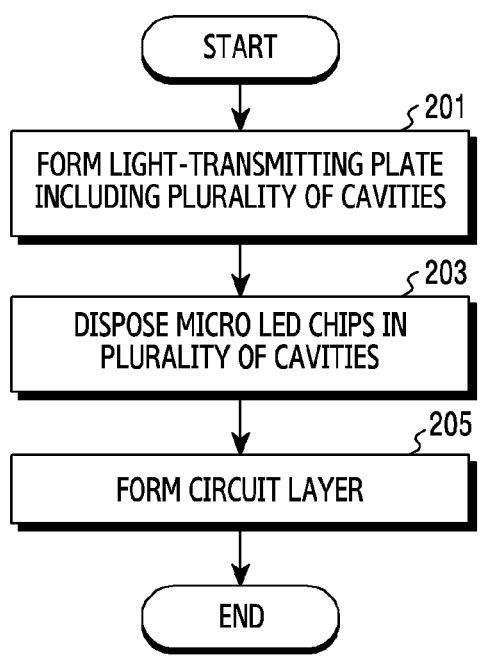
FIG. 2 is a flowchart of a method for manufacturing a display including micro LED chips according to an embodiment.

According to an embodiment, the plurality of micro LED chips 102 separated from the substrate 101 may be embedded as a light-emitting element of the display through the following process flows of FIG. 2. A light-emitting chip of another type having a size or a volume such as the size or the volume of a micro LED chip also may be embedded in the display through the process flows of FIG. 2. Although not listed, a light-emitting chip that may replace a micro LED chip may be defined as a micro light-emitting chip, and may be various according to a convergence trend.

FIG. 2 is a flowchart of a method for manufacturing a display including micro LED chips according to an embodiment. FIGS. 3A to 3H are cross-sectional views for explaining a method for manufacturing a display including micro LED chips according to an embodiment.

Referring to FIG. 2, in process 201, a light-transmitting plate including a plurality of cavities may be disposed. According to an embodiment, the light-transmitting plate may include a material having a coefficient of thermal expansion (CTE) of substantially not more than $10 \times 10^{-6}$ m/m° C.

Figure 3A:
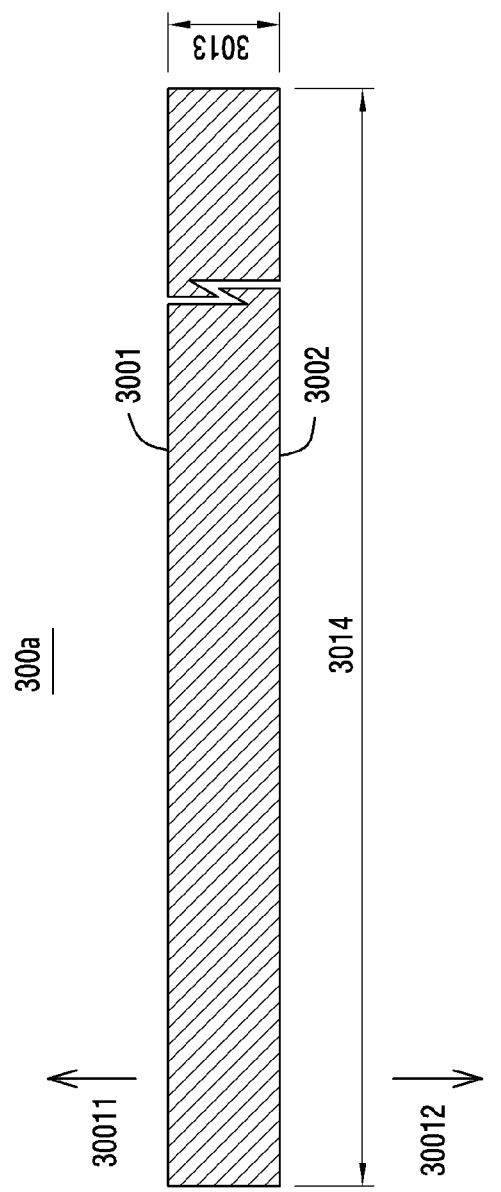
FIGS. 3A, 3B, 3C, 3D, 3E, 3F, 3G, and 3H are cross-sectional views for explaining a method for manufacturing a display including micro LED chips according to an embodiment.

Referring to FIG. 3A, in an embodiment, a first plate (or a first layer) 300a for coupling micro LED chips may be provided. The first plate 300a may include a first surface 3001 that faces a first direction 30011 and a second surface 3002 that faces a second direction 30012 that is opposite to the first direction 30011. In an embodiment, the thickness 3013 of the first plate 300a may be substantially not more than 500 μm, but may be designed differently in consideration of the sizes of the micro LED chips. Although not illustrated, when viewed in the second direction 30012, the first plate 300a may have a rectangular shape, and the length 3014 of the width or depth of the first plate 300a may be various according to the number of the micro LED chips coupled to the first plate 300a.

According to an embodiment, the first surface 3001 or the second surface 3002 may be designed to have a surface flatness or a surface roughness that is 0 or close to 0. For example, an average roughness value Ra or a maximum roughness value Rmax of the center line of the first surface 3001 or the second surface 3002 may be substantially not more than 5 μm.

According to an embodiment, the first plate 300a may include a heat-resistant material that is softened or maintains properties at a high temperature. The heat-resistant property may further include a property of enduring a rapid change (e.g., a thermal impact) of temperature. For example, the first plate 300a may include a material having a coefficient of thermal expansion of substantially not more than $10 \times 10^{-6}$ m/m° C. In some embodiments, the first plate 300a may include a material that further has characteristics, such as mechanical strength, chemical durability, transparency, or electrical insulation. For example, the first plate 300a may include a material having a mechanical strength, such as a tensile strength that is smaller or larger than steel, elastic modulus, or compressibility.

According to an embodiment, the first plate 300a may include glass formed of an element such as selenium or sulfur, an oxide such as silicon, boron, or germanium, or an inorganic material such as an oxysalt, a sulfide, a selenide, or a halide. For example, the first plate 300a may include glass that has a relatively low coefficient of thermal expansion and is strong to a thermal impact, for example, quartz glass, borosilicate glass, or aluminasilicate glass. The glass of the first plate 300a may include a material of a basic network form, or may further include an auxiliary material that is chemically coupled to the material of a basic network form to have characteristics, such as mechanical strength, chemical durability, transparency, electrical insulation, or coloring property.

According to various embodiments, the first plate 300a may include a material having electrically insulation. In an embodiment, when the first plate 300a is formed of glass, glass having a relatively low dielectric coefficient may be used to prevent loss of energy due to glass. In some embodiments, the first plate 300a may be formed of glass having a low dielectric loss. In another embodiment, because electric charges may be transported (ion transportation) under an operation of electric fields when sodium ions are present in glass, the first plate 300a may be formed of glass, of which the alkali content such as sodium is low, to prevent deterioration of the performance of the micro LED chips.

According to various embodiments, the first plate 300a may include glass having various optical properties such as an index of refraction or an index of dispersion. For example, the first plate 300a may be formed of glass having a light transmittance of substantially not less than 80%. In some embodiments, the first plate 300a may be designed to or not to transmit light of a specific wavelength band, such as an ultraviolet ray or an infrared ray.

Although all the materials of the first plate 300a may not be listed, the materials of the first plate 300a are not limited to glass such as hard glass or Pyrex glass but may be any other materials having characteristics such as mechanical strength, chemical durability, transparency, or electrical insulation that are more excellent than those of glass.

Figure 3B:
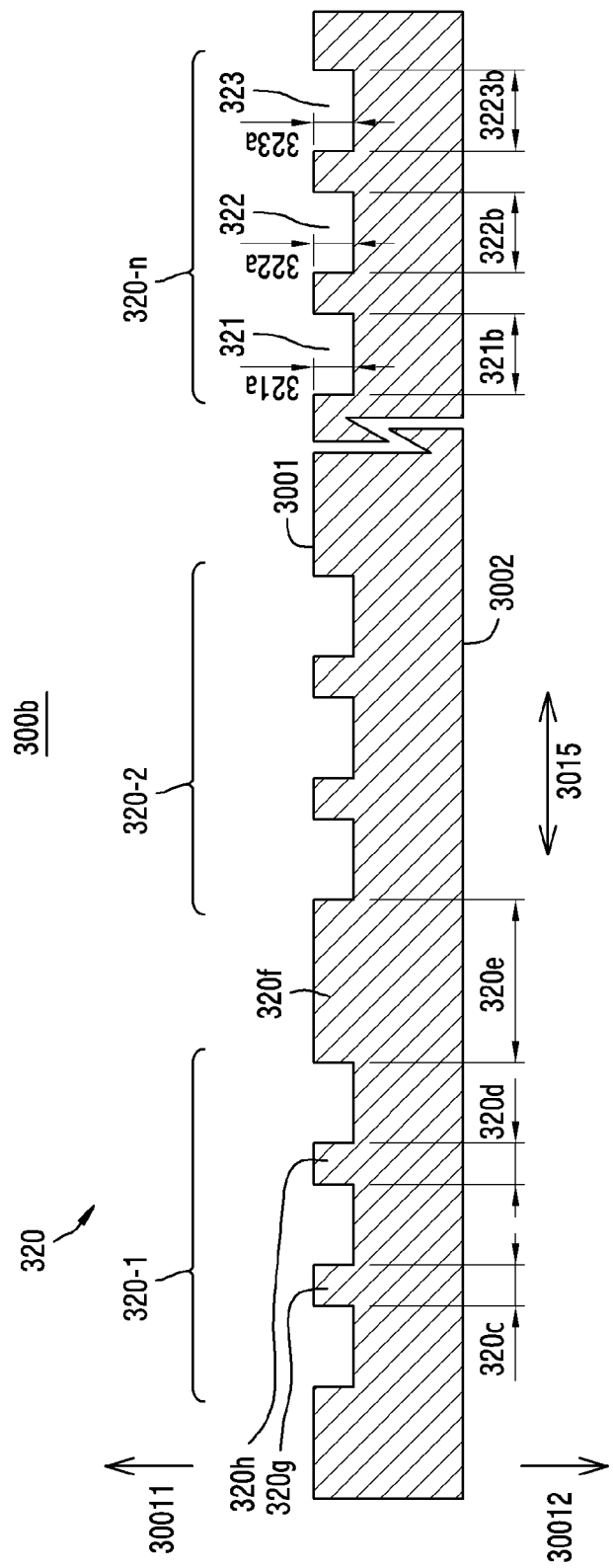

Referring to FIGS. 3A and 3B, in an embodiment, by cutting the first surface 3001 of the first plate 300a by using a cutting tool, a second plate 300b having grooves, recess, or cavities 320 recessed in the second direction 30012 may be formed. The cavities 320 may include a cavity group (or a cavity set) 320-n having a first cavity 321, a second cavity 322, and a third cavity 323. The first cavity 321, the second cavity 322, and the third cavity 323 may be disposed in a row in a line direction 3015 corresponding to the depth or the width of the second plate 300b. In some embodiments, the first cavity 321, the second cavity 322, and the third cavity 323 may be disposed in various other arrangement structures without being limited to a line arrangement structure. In some embodiments, the cavity group 320-n may be designed to further include an additional cavity. According to various embodiments, the cavity group 320-n is not limited to the location or the numbers illustrated in FIG. 3B.

In an embodiment, when viewed in a cross-section, the first cavity 321, the second cavity 322, or the third cavity 323 may have a rectangular shape having a depth or a width. For example, the first cavity 321, the second cavity 322, or the third cavity 323 may have a space of substantially not more than $300 \times 300 \times 300$ μm³. In some embodiments, at least any one of the width, the depth, and the height of the first cavity 321, the second cavity 322, or the third cavity 323 may be designed to be not more than 300 μm. In some embodiments, the first cavity 321, the second cavity 322, or the third cavity 323 is not limited to a rectangular cross-section structure, but may be other cross-sectional structure according to the shapes of micro LED chips.

In an embodiment, the first cavity 321 may be a space, into which a micro LED chip (hereinafter, a red micro LED chip) for outputting light of a red color is inserted. In an embodiment, the second cavity 322 may be a space, into which a micro LED chip (hereinafter, a green micro LED chip) for outputting light of a green color is inserted. In an embodiment, the third cavity 323 may be a space, into which a micro LED chip (hereinafter, a blue micro LED chip) for outputting light of a blue color is inserted. According to some embodiments, the second plate 300b may be designed to further include cavities for disposing micro LED chips that output light of colors that are different from a red color, a green color, and a blue color.

According to an embodiment, the depth 321a of the first cavity 321, the depth 322a of the second cavity 322, and the depth 323a of the third cavity 323 may be designed to be the same. In some embodiments, the red micro LED chip, the green micro LED chip, and the blue micro LED chip may have different heights, and the depth 321a of the first cavity 321, the depth 322a of the second cavity 322, and the depth 323a of the third cavity 323 may be designed differently. The depth 321a of the first cavity 321, the depth 322a of the second cavity 322, and the depth 323a of the third cavity 323, for example, may be designed to substantially not more than 300 μm.

According to an embodiment, the width 321b of the first cavity 321, the width 322b of the second cavity 322, and the width 323b of the third cavity 323 may be designed to be the same. In some embodiments, the red micro LED chip, the green micro LED chip, and the blue micro LED chip may have different widths or different depths. For example, the width 321b of the first cavity 321, the width 322b of the second cavity 322, and the width 323b of the third cavity 323 may be designed differently.

According to an embodiment, the width 321b of the first cavity 321, the width 322b of the second cavity 322, and the width 323b of the third cavity 323 may have sizes that are the same as the width or the depth of the micro LED chip or includes a tolerance. The width 321b of the first cavity 321, the width 322b of the second cavity 322, and the width 323b of the third cavity 323, for example, may be substantially not more than 300 μm.

According to an embodiment, a gap 320c between the first cavity 321 and the second cavity 322 and a gap 320d between the second cavity 322 and the third cavity 323 may be designed to be the same. The gaps 320c and 320d, for example, may be designed to be substantially not more than 500 μm. In some embodiments, the gaps 320c and 320d may be designed differently.

In an embodiment, a gap 320e between the cavity groups 320 may be disposed constantly. In some embodiments, the gap 320e between the cavity groups 320 may be designed not to be constant.

In some embodiments, at least a portion 320f between the cavity groups 320 may be designed to include a material having dark colors such as black.

In some embodiments, at least a portion 320g between the first cavity 321 and the cavity 322, or at least a portion 320h between the second cavity 322 and the third cavity 323 may be designed to include a material having dark colors such as black. In some embodiments, it may be designed such that an additional material having a black color covers an area corresponding to the portions 320f, 320g, and 320h of the first surface 3001.

In some embodiments, one or more plates (or layers) coupled to the second surface 3002 of the second plate 300b may be further added. In an embodiment, the added plate is an element that is separated from the second plate 300b consequently, and may function to prevent deformation, shaking, or breakdown of the second plate 300b in a process of coupling the plurality of micro LED chips to the second plate 300b. The added plate may be formed of various materials (e.g., glass) having characteristics such as a mechanical strength, a heat-resistant property, or a chemical durability.

Referring FIG. 2 again, according to an embodiment, in process 203, the micro LED chips may be disposed in the plurality of cavities.

Figure 3C:
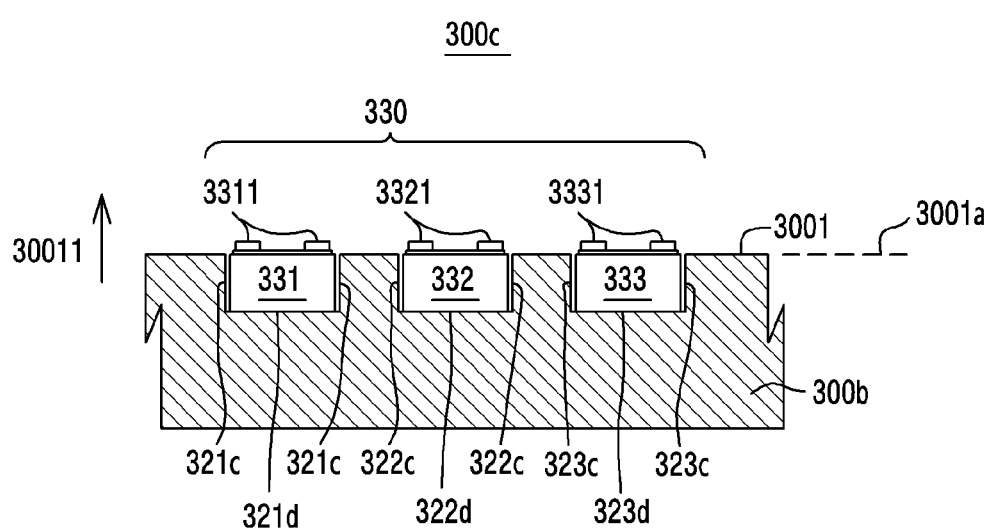

Referring to FIGS. 3B and 3C, a third plate 300c in which the micro LED chips are coupled to the second plate 300b may be formed. For example, the red micro LED chip 331 may be inserted into the first cavity 321, the green micro LED chip 332 may be inserted into the second cavity 322, and the blue micro LED chip 333 may be inserted into the third cavity 323. The contact surfaces 3311, 3321, and 3331 of the micro LED chips 331, 332, and 333 disposed in the cavities 321, 322, and 323 may face the first direction 30011.

Referring to FIG. 1, the plurality of micro LED chips 102 may be separated by cutting the substrate 101, and may be fed to the second plate 300b by using a pickup tool. For example, the pickup tool may be a device that uses an electrostatic scheme of instantaneously transferring a chip by using static electricity, a van der Waals force scheme of transferring a chip by using an attractive force generated when distribution of electric charges of atoms or molecules is changed, a scheme of transferring a chip by using an electrostatic head, or a scheme of transferring a chip by using an elastic rubber stamp. The substrate 101 of FIG. 1 simply illustrates one substrate for micro LED chips for outputting light of the same color, and a substrate for the red micro LED chips, a substrate for the green micro LED chips, and a substrate for the blue micro LED chips may be disposed as in the substrate 101 of FIG. 1. The plurality of red micro LED chips separated by cutting one substrate 101 may be fed onto a first temporary substrate. The plurality of green micro LED chips separated by cutting another substrate 101 may be fed onto a second temporary substrate. Further, the plurality of blue micro LED chips separated by cutting another substrate 101 may be fed onto a third temporary substrate. The one or more red micro LED chips, the one or more green micro LED chips, and the one or more blue micro LED chips may be fed to the second plate 300b after being separated from the first, second, and third temporary substrates. According to an embodiment, the plurality of micro LED chips may be fed from the temporary substrates to the second plate 300b individually or at once. According to some embodiment, a process of directly feeding the one or more micro LED chips from the substrate 101 of FIG. 1 to the second plate 300b without feeding the micro LED chips onto the temporary substrates may be designed.

According to various embodiments, referring to FIG. 3C, a process of, after feeding a plurality of chip groups 330 including a red micro LED chip 331, a green micro LED chip 332, and a blue micro LED chip 333 to a temporary substrate, feeding the plurality of chip groups from the temporary substrate to the second plate 300b individually or at once also may be designed.

According to an embodiment, the contact surfaces 3311, 3321, and 3331 of the micro LED chips 331, 332, and 333 may protrude from the first surface 3001. In some embodiments, the contact surfaces 3311, 3321, and 3331 may be designed not to protrude from the first surface 3001 in the first direction 30011. For example, the contact surfaces 3311, 3321, and 3331 may define a plane 3001a together with the first surface 3001.

According to an embodiment, the first cavity 321 may have a shape including a side surface 321c and a bottom surface 321d, and the second cavity 322 and the third cavity 323 also have a similar shape and may include a side surface 322c and 323c and a bottom surface 322d and 323d. According to an embodiment, the third plates 300c may include a material, such as a resin, which is disposed between the micro LED chips 331, 332, and 333 and the bottom surfaces 321d, 322d, and 323d. For example, the micro LED chips 331, 332, and 333 may be fixed to the bottom surfaces 321d, 322d, and 323d coated with the resin. The resin, for example, may have a light transmittance of not less than 90%, and the light output from the micro LED chips 331, 332, and 333 may pass through the resin and may be delivered to the second plate 300b. In some embodiments, the resin may include various materials having characteristics such as thermal resistance, chemical durability, or electrical insulation.

Figure 3D:
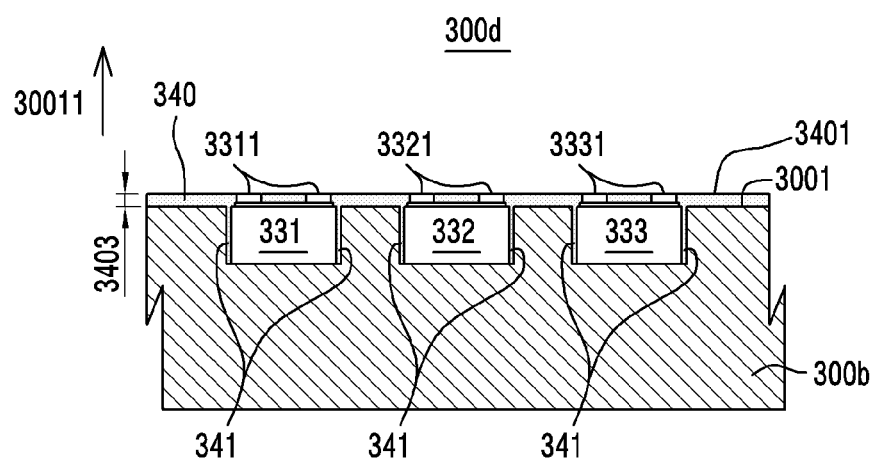

Referring to FIGS. 3C and 3D, in an embodiment, a fourth plate 300d, in which a layer (hereinafter, a resin layer) 340 including a material such as a resin is coupled to the third plate 300c, may be formed. The resin layer 340 may cover the first surface 3001 of the second plate 300b and the micro LED chips 331, 332, and 333. The micro LED chips 331, 332, and 333 may be fixed to the second plate 300b by the resin layer 340. In an embodiment, the thickness 3403 of the resin layer 340 may be designed to be substantially not more than 200 μm, but the disclosure is not limited thereto.

In some embodiments, when a gap (or tolerances) is present between the micro LED chip 331, 332, and 333 and the side surface 321c, 322c, and 323c, the resin layer 340 may include a portion 341 disposed in the gap. For example, a resin layer 340 is formed by coating a melted resin on the third plate 300c, and the melted resin may flow into the gap between the micro LED chip 331, 332, and 333 and the side surface 321c, 322c, and 323c. The resin layer 340 may be a material having characteristics such as thermal resistance, electrical insulation, mechanical strength, or chemical durability.

In an embodiment, the contact surfaces 3311, 3321, and 3331 of the micro LED chips 331, 332, and 333 may be designed not to protrude from the resin layer 340 in the first direction 30011. For example, the contact surfaces 3311, 3321, and 3331 may define planes together with the surface 3401 formed with the resin layer 340. In some embodiments, the contact surfaces 3311, 3321, and 3331 may be designed to be covered by the resin layer 340 or protrude from the resin layer 340 in the first direction 30011.

In some embodiments, at least a portion of the resin layer 340, which covers the first surface 3001 of the second plate 300b, may be designed to include a material having a dark color such as black.

Referring to FIG. 2 again, according to an embodiment, in process 205, a circuit layer may be formed.

Figure 3E:
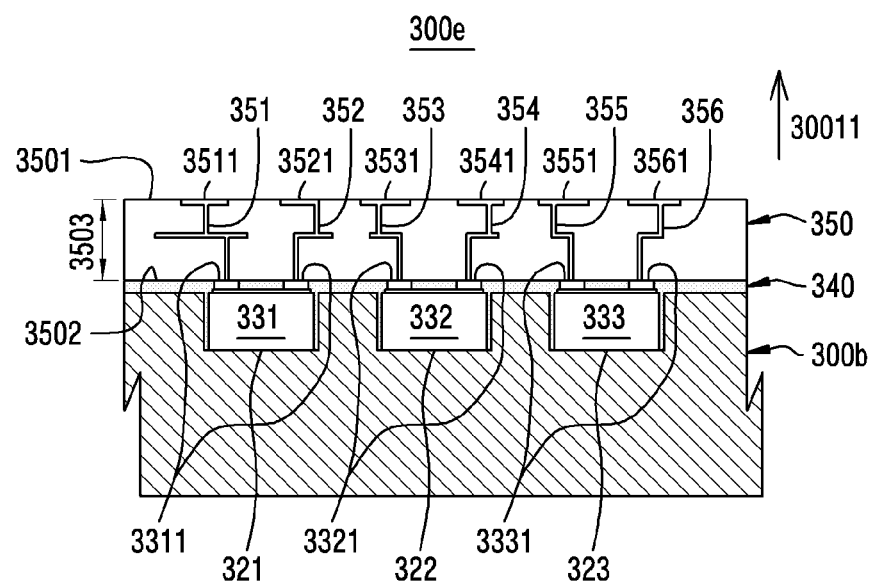

Referring to FIGS. 3D and 3E, in an embodiment, a fifth plate 300e, in which a circuit layer 350 is coupled to the fourth plate 300d, may be formed. In an embodiment, the circuit layer 350 may be a layer (e.g., a re-distribution layer (RDL)) formed through re-circuiting. The circuit layer 350 may include a surface 3502 bonded to the resin layer 340 and a surface 3501 that faces the first direction 30011. The thickness 3503 of the circuit layer 350, for example, may be designed to be substantially not more than 300 μm, but the disclosure is not limited thereto. The circuit layer 350 may include conductive paths (or circuits) 351, 352, 353, 354, 355, and 356 formed in the interior thereof. The conductive paths 351 and 352 may be electrically connected to the contact surfaces 3311 of the red micro LED chips 331, and the ends 3511 and 3521 thereof may be exposed to the surface 3501 to be used as pads. The conductive paths 353 and 354 may be electrically connected to the contact surfaces 3321 of the green micro LED chips 332, and the ends 3531 and 3541 thereof may be exposed to the surface 3501 to be used as pads. The conductive paths 355 and 356 may be electrically connected to the contact surfaces 3331 of the green micro LED chips 333, and the ends 3551 and 3561 thereof may be exposed to the surface 3501 to be used as pads.

In an embodiment, the circuit layer 350 may include a material of a coefficient of thermal expansion that is the same as or different form that of the second plate 300b or the resin layer 340.

In some embodiments, a plate, in which a circuit layer 350 is coupled to the third plate 300c of FIG. 3 without using the resin layer 340, may be formed.

Figure 3F:
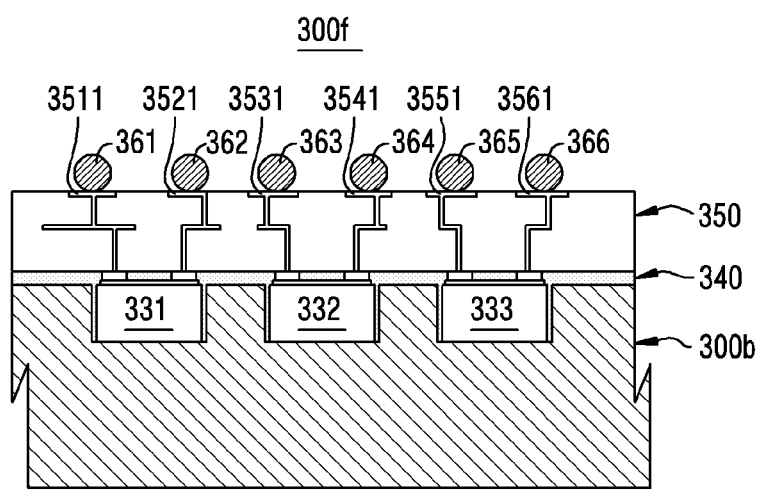
Figure 3G:
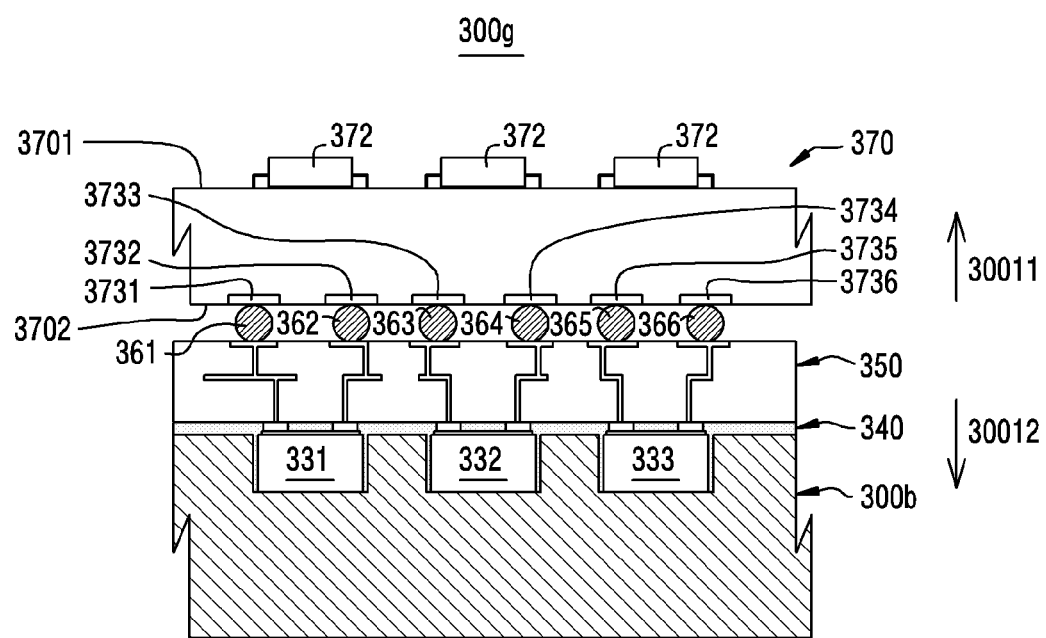
Figure 3H:
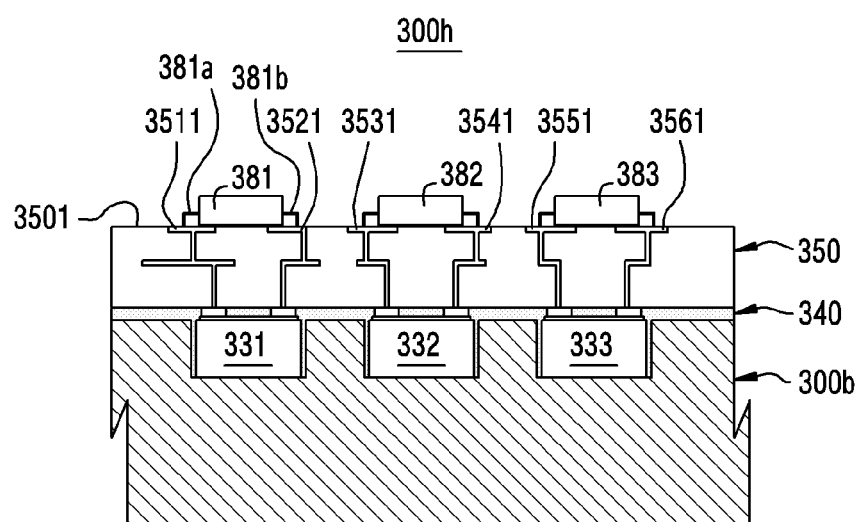

According to various embodiments, the method for manufacturing a display including micro LED chips may further include a process of forming the structure of FIG. 3F, 3G, or 3H.

Referring to FIGS. 3E and 3F, a six plate 300f, in which solder balls 361, 362, 363, 364, 365, and 366 are coupled to the ends (hereinafter, pads) 3511, 3521, 3531, 3541, 3551, and 3561 of the circuit layer 350, may be formed.

Referring to FIGS. 3F and 3G, a seventh plate 300g, in which a circuit board 370 is coupled to the sixth plate 300f, may be formed. The circuit board 370 may include a surface 3701 that faces the first direction 30011, and may include one or more elements 372 mounted to the surface 3701. The one or more elements 372 may be LED driving elements for the micro LED chips 331, 332, and 333, and may include circuits, such as a switch, for adjusting an on/off operation or the intensity of current for the micro LED chips 331, 332, and 333. In some embodiments, the one or more elements 372 may be designed to be embedded in the interior of the circuit board 370. The circuit board 370 may include a surface 3702 that faces the second direction 30012, and may include a plurality of lands (or pads) 3731, 3732, 3733, 3734, 3735, and 3736 formed on the surface 3702. Conductive paths that connect the one or more elements 372 and the plurality of lands 3731, 3732, 3733, 3734, 3735, and 3736 may be embedded in the circuit board 370. The circuit board 370 is fed to the sixth plate 300f such that the plurality of lands 3731, 3732, 3733, 3734, 3735, and 3736 are arranged in the solder balls 361, 362, 363, 364, 365, and 366, and the solder balls 361, 362, 363, 364, 365, and 366 may be fused to the plurality of lands 3731, 3732, 3733, 3734, 3735, and 3736.

In some embodiments, although not listed, various conductive materials, such as an anisotropic conductive film (ACF) may be used for connecting the fifth plate 300e and the circuit board 370 instead of the solder balls 361, 362, 363, 364, 365, and 366. In some embodiments, a flexible conductive member (e.g., a flexible printed circuit board (FPCB) that has a length extending from a first end connected to the fifth plate 300e to a second end connected to the circuit board 370 while a conductive material, such as the solder balls 361, 362, 363, 364, 365, and 366 is not interposed between the fifth plate 300e and the circuit board 370 may be designed.

In some embodiments, referring to FIGS. 3E and 3H, an eighth plate 300h, in which a plurality of elements 381, 382, and 383 are disposed in the circuit layer 350 of the fifth plate 300e, may be formed. The first element 381 may include a circuit for driving the red micro LED chip 331, and leads 381a and 381b of the first element 381 may be connected to the pads 3511 and 3521 on the surface 3501 of the circuit layer 350. The second element 382 may include a circuit for driving the green micro LED chip 332, and leads of the second element 382 may be connected to the pads 3531 and 3541 of the circuit layer 350 similarly to the first element 381. The third element 383 may include a circuit for driving the blue micro LED chip 333, and leads of the first element 383 may be connected to the pads 3551 and 3561 of the circuit layer 350 similarly to the first element 381.

In some embodiments, instead of the first, second, and third elements 381, 382, and 383, one element for driving a plurality of micro LED chips may be coupled to the circuit layer 350.

The display, for example, may be defined by one of the fourth plate 300d of FIG. 3D, the fifth plate 300e of FIG. 3E, the sixth plate 300f of FIG. 3F, the seventh plate 300g of FIG. 3G, or the eighth plate 300h of FIG. 3H.

In some embodiments, the circuit layer 350 may be designed to include a circuit (hereinafter, a display driving circuit) (not illustrated) capable of driving the micro LED chips 331, 332, and 333. If a display including the micro LED chips 331, 332, and 333 and the circuit layer 350 is installed in an electronic device such as a portable terminal, the display driving circuit may be electrically connected to a control circuit such as a processor of the electronic device. In some embodiments, a circuit such as a display drive integrated (DDI) circuit that connects the processor and the display driving circuit may be present, and the circuit may be designed to be included in the display or be separate from the display. In some embodiments, the display driving circuit of the circuit layer 350 may be designed as a part of a circuit such as a DDI circuit. The display driving circuit may adjust electric power (e.g., a voltage or current) supplied to the micro LED chips 331, 332, and 333 under the control of the processor. When the electric power supplied to the micro LED chips 331, 332, and 333 is controlled, the on/off operations or the intensities of light of the micro LED chips 331, 332, and 333 may be adjusted. According to an embodiment, the display driving circuit may include switches, and the switches may adjust electric power to the micro LED chips 331, 332, and 333 under the control of the processor. The switches included in the circuit layer 350 may be transistors. According to an embodiment, the circuit layer 350 may be designed to include a thin film transistor (TFT) embedded therein. The TFT may include a source electrode, a drain electrode, a gate electrode, and a semiconductor layer. The source electrode may be an electrode that supplies electrons, the drain electrode may be an electrode that receives electrons, and the gate electrode may be an electrode for switching flows of electrons from the source electrode to the drain electrode. The semiconductor layer may be a path, along which electrons flow, when the gate electrode applies a predetermined voltage or higher. The semiconductor layer is an element that converts the switch to an on state, and may be defined as an 'active layer' or an 'active area' of the switch. If a signal (e.g., a voltage) of a threshold or more is applied to the gate electrode, the semiconductor layer, like a conductor, may allow flows of electrons, and the electrons may flow from the source electrode to the drain electrode through the semiconductor layer. A voltage may be applied to the micro LED chips 331, 332, or 333 due to the flows of the electrons, and the micro LED chips 331, 332, or 333 may output light. In an embodiment, the wires 351, 352, 353, 354, 355, and 356 may define at least a portion of the TFT.

Because the circuit layer 350 may replace the circuit board 370 including the one or more elements 372 of FIG. 3G or the one or more elements 381 of FIG. 3H when the fifth plate 300e of FIG. 3E is designed to have the circuit layer 350, in which the display driving circuit such as a TFT is embedded, the processes for the fifth plate 300e to the seventh plate 300g or the eighth plate 300h may be omitted. If the display having the fifth plate 300e is installed in an electronic device, such as a portable terminal, the display driving circuit of the circuit layer 350 may be electrically connected to the processor of the electronic device. According to an embodiment, the electronic device may include a PCB, on which a processor, a memory, a communication module, and a sensor module are mounted, and the PCB and the fifth plate 300e may be electrically connected by a connection means such as an FPCB. In some embodiments, a DDI circuit that connects the processor and the display driving circuit may be provided. The DDI circuit may be designed to be included in the display or be separate from the display. The DDI circuit may include a gate integrated circuit (IC) for switching on or off pixels, and a source IC for making the colors different by adjusting the amounts of image signals of the pixels. The display may include a plurality of gate lines electrically connected to the gate electrodes of the TFGs, and a plurality of source electrodes electrically connected to the source electrodes of the TFTs. The gate IC may be electrically connected to the plurality of gate lines, the source IC may be electrically connected to the plurality of source lines, and the DDI circuit may adjust the TFTs under the control of the processor. The gate lines and the source lines may be designed to be embedded in the circuit layer 350. According to an embodiment, the circuits 351, 352, 353, 354, 355, and 356 may define at least some of the gate lines and the source lines.

FIGS. 4A to 4H are cross-sectional views for explaining a method for manufacturing a display including micro LED chips according to another embodiment. Hereinafter, referring to FIG. 2 again, FIGS. 4A, 4B, 4C, 4D, 4F, 4G, and 4H will be described.

According to an embodiment, in process 201 of FIG. 2, a light-transmitting plate including a plurality of cavities may be formed.

Figure 4A:
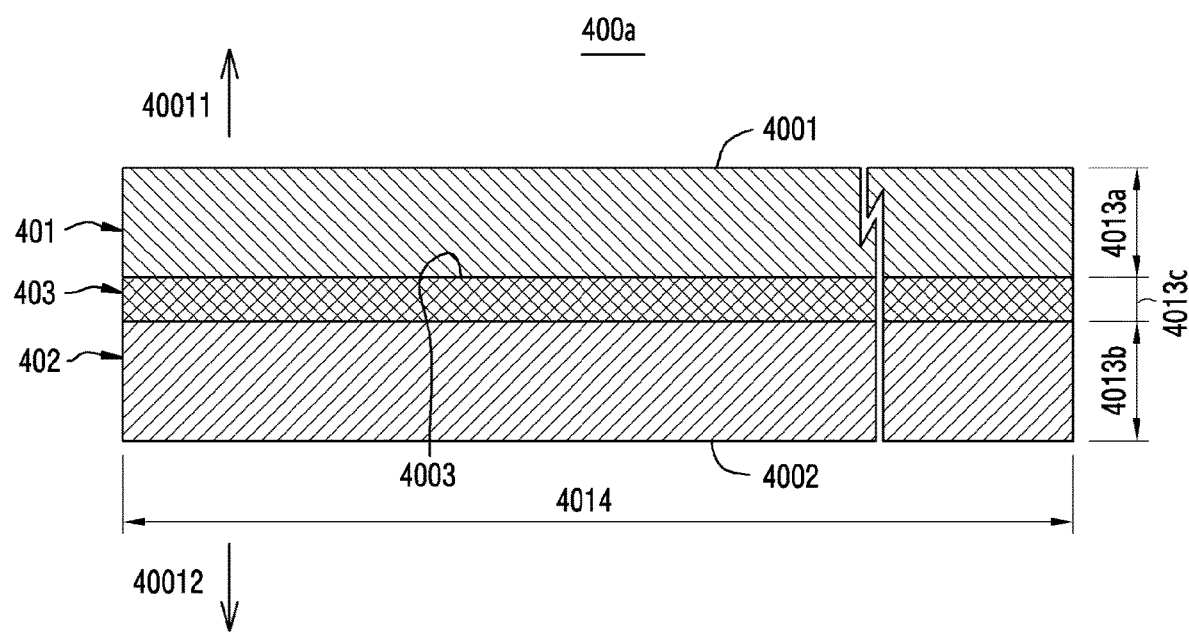
FIGS. 4A, 4B, 4C, 4D, 4E, 4F, 4G, and 4H are cross-sectional views for explaining a method for manufacturing a display including micro LED chips according to another embodiment.

Referring to FIG. 4A, in an embodiment, an eleventh plate 400a for coupling the micro LED chips may be provided. The eleventh plate 400a may include an eleventh surface 4001 that faces a first direction 40011 and a twelfth surface 4002 that faces a twelfth direction 40012 that is opposite to the eleventh direction 40011. Hereinafter, it may be defined that element B and element C are located under element A and element B is located between element A and element C when element A, element B, and element C are disposed in their sequence in the twelfth direction 40012. The eleventh plate 400a may include an upper plate (or an upper layer 401) that defines the eleventh surface 4001, a lower plate (or a lower layer) 402 that is disposed under the upper plate 401 and defines the twelfth surface 4002, and a middle plate (or a middle layer) 403 disposed between the upper plate 401 and the lower plate 402.

According to an embodiment, the thickness 4013a of the upper plate 401, the thickness 4013b of the lower plate 402, or the thickness 4103c of the middle plate 403 may be designed to be substantially not more than 500 μm, but may be designed differently in consideration of the sizes of the micro LED chips. Although not illustrated, the eleventh plate 400a has a rectangular shape when viewed from the twelfth direction 40012, and the length 4014 of the width and the depth thereof may be various according to the number of the micro LED chips coupled to the eleventh plate 400a.

According to an embodiment, a bonding surface (hereinafter, a thirteenth surface) 4003 between the eleventh surface 4001 and the upper plate 401 and the middle plate 402 may be designed to have a surface flatness or a surface roughness that is 0 or close to 0. For example, an average roughness value Ra or a maximum roughness value (Rmax) of the eleventh surface 4001 or the thirteenth surface 4003 may be designed to be substantially not more than 5 µm.

The upper plate 401, for example, may include a material having at least one property that is similar to or the same as that of the first plate 300a of FIG. 3A, and a detailed description thereof will be omitted. The middle plate 403 may include various materials coupled to the upper plate 401 and the lower plate 402. The middle plate 403 and the lower plate 402 may function to prevent deformation, shaking, or damage of the upper plate 401 in the process of coupling the plurality of micro LED chips to the upper plate 401, and may be separated from the upper plate 401 consequently. For example, the middle plate 403 or the lower plate 402 may be formed of a material having characteristics such as mechanical strength, thermal resistance, or chemical durability. According to an embodiment, the lower plate 402 may include a material having at least one property that is similar to or the same as that of the upper plate 401. In an embodiment, the upper plate 401 and the lower plate 402 may be formed of glass. In some embodiments, the lower plate 402 may be formed of a material that is different from that of the upper plate 401.

Figure 4B:
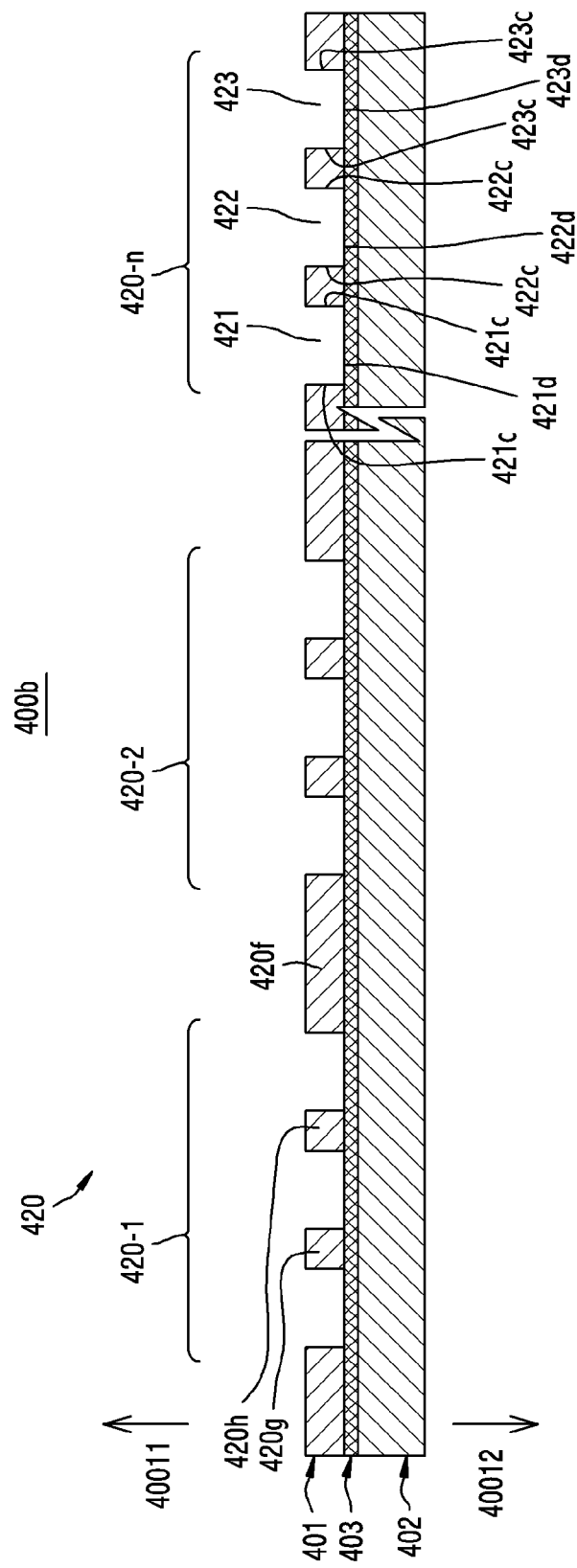

Referring to FIGS. 4A and 4B, in an embodiment, a twelfth plate 400b having grooves recessed in the twelfth direction 40012 or cavities 420 by cutting the upper plate 401 by using a cutting tool. The upper plate 401 may be made to have holes through cutting and the cavities 420 may be provided due to the holes. In some embodiments, the twelfth plate 400b also may be formed in a scheme of coupling the upper plate including the holes to the lower plate 402, to which the middle plate 403 is attached.

According to an embodiment, the cavities 420 may include a cavity group 420-n having a first cavity 421, a second cavity 422, and a third cavity 423. According to an embodiment, the first cavity 421 is a space, into which the red micro LED chip is inserted, the second cavity 422 is a space, into which the green micro LED chip is inserted, and the third cavity 423 is a space, into which the blue micro LED chip is inserted. When viewed in a cross-section, the first cavity 421, the second cavity 422, or the third cavity 423 may have rectangular shapes having side surfaces 421c, 422c, and 423c and bottom surfaces 421d, 422d, and 423d. The side surfaces 421c, 422c, and 423c correspond to the inner surfaces of the holes formed in the upper plate 401, and the bottom surfaces 421d, 422d, and 423d may be defined by the middle plate 403. When compared with the cavities 320 of FIG. 3B, the cavities 420 of FIG. 4B are different only in that the spaces thereof are limited by the middle plate 403 but the shapes, the sizes, the arrangement structures thereof are similar to or the same as those of the cavities 320 of FIG. 3B, and a detailed description thereof will be omitted.

In some embodiments, at least a portion 420f between the cavity groups 420, at least a portion 420g between the first cavity 421 and the second cavity 422, or at least a portion 420h between the second cavity 422 and the third cavity 423 are designed to include a material having a dark color such as black.

In process 203 of FIG. 2, according to an embodiment, the micro LED chips may be disposed in the plurality of cavities.

Figure 4C:
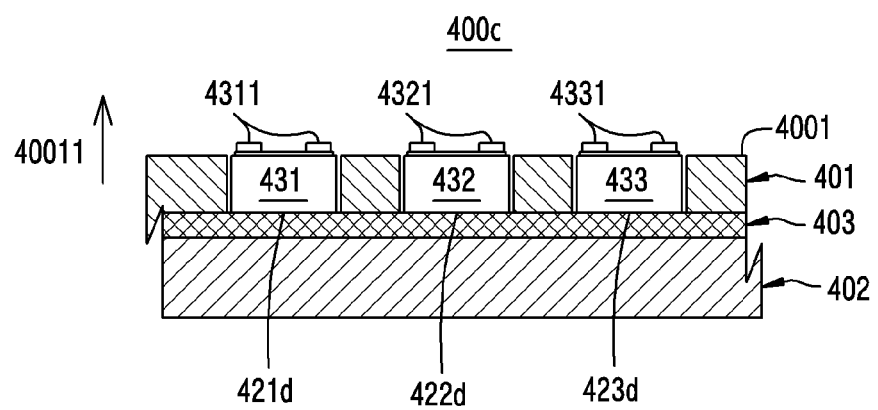

Referring to FIGS. 4B and 4C, in an embodiment, a thirteenth plate 400c, in which the micro LED chips are coupled to the twelfth plate 400b, may be formed. The red micro LED chip 431 may be disposed in the first cavity 421, the green micro LED chip 432 may be disposed in the second cavity 422, and the blue micro LED chip 433 may be disposed in the third cavity 423. A scheme of feeding the plurality of micro LED chips 431, 432, and 433 to the plurality of cavities 420 is similar to or the same as the scheme described with reference to FIGS. 3B and 3C, and a detailed description thereof will be omitted.

In an embodiment, the contact surfaces 4311, 4321, and 4331 of the micro LED chips 431, 432, and 433 coupled to the twelfth plate 400b may face the eleventh direction 40011. The contact surfaces 4311, 4321, and 4331 may protrude from the first surface 4001, but in some embodiments, may be designed not to protrude.

In an embodiment, the micro LED chips 431, 432, and 433 may be fixed to the bottom surfaces 421d, 422d, and 423d coated with a resin. In an embodiment, the resin may be an element that is separated from the thirteenth plate 400c consequently together with the lower plate 402 and the middle plate 403, and may prevent shaking or damage of the micro LED chips 431, 432, and 433 in a process of manufacturing the display. The resin may be designed to have characteristics such as a thermal resistance, a mechanical strength, a chemical durability, and the like.

In some embodiments, because the resin may be an element included in the display and the resin covers the micro LED chips, it may be designed such that the light output from the micro LED chips 431, 432, and 433 may has various optical properties.

Figure 4D:
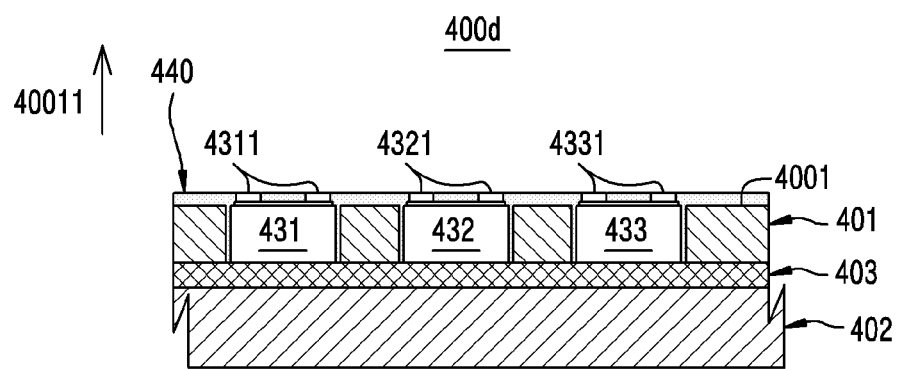

Referring to FIGS. 4C and 4D, in an embodiment, a fourteenth plate 400d, in which a layer (hereinafter, a resin layer) 440 including a material, such as a resin, is coupled to the thirteenth plate 400c, may be formed. The resin layer 440 is similar to or the same as the resin layer 340 described with reference to FIGS. 3C and 3D, and a detailed description thereof will be omitted.

In some embodiments, at least a portion of the resin layer 440, which covers the first surface 4001 of the upper plate 401, may be designed to include a material having a dark color such as black.

In an embodiment, the contact surfaces 4311, 4321, and 4331 of the micro LED chips 431, 432, and 433 may not protrude from the resin layer 440 in the eleventh direction 40011, but in some embodiments, may be designed to protrude.

In process 205 of FIG. 2, according to an embodiment, a circuit layer may be formed.

Figure 4E:
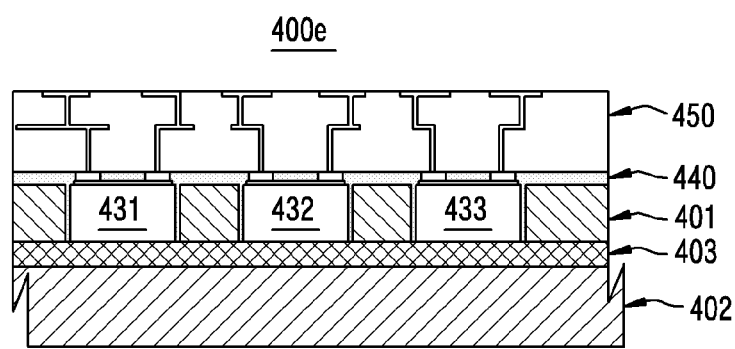

Referring to FIGS. 4D and 4E, a fifteenth plate 400e, in which a circuit layer 450 is coupled to the fourteenth plate 400d, may be formed. The circuit layer 450 is similar to or the same as the circuit layer 350 described with reference to FIGS. 3D and 3E, and a detailed description thereof will be omitted.

In some embodiments, a plate, in which the circuit layer 450 is coupled to the thirteenth plate 400c without using a resin layer 440, may be formed.

Figure 4F:
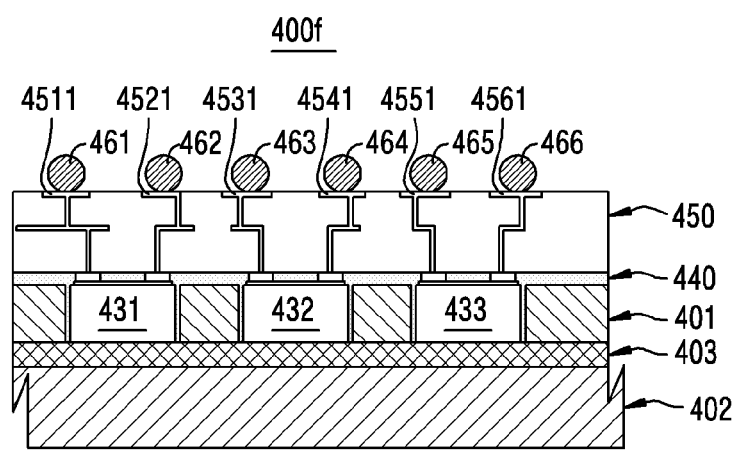
Figure 4G:
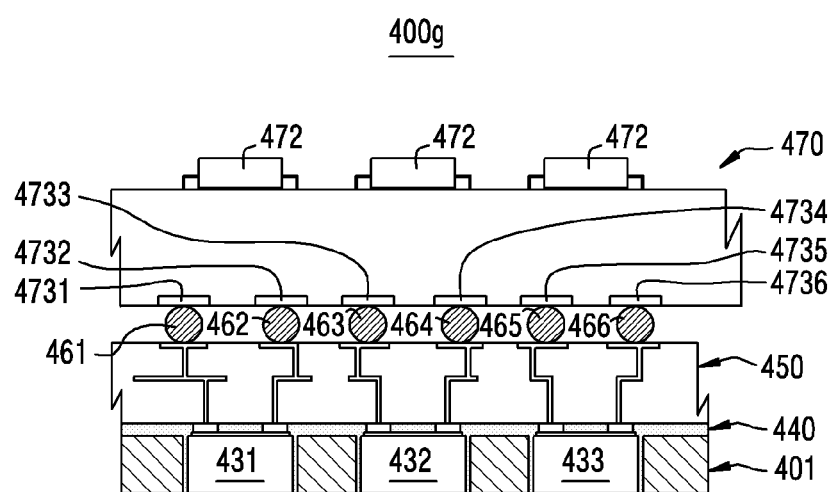
Figure 4H:
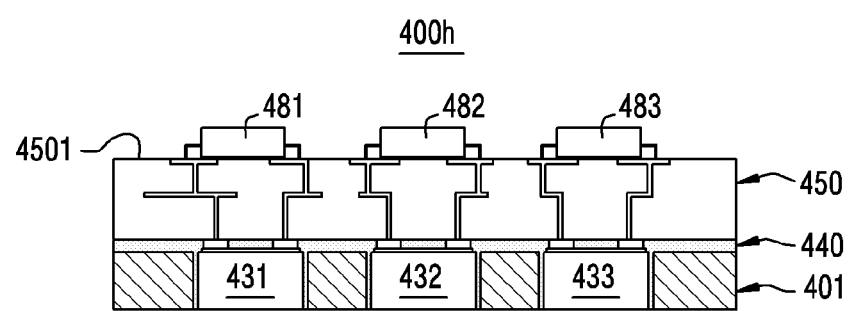

According to various embodiments, the process of manufacturing a display including micro LED chips may further include a process of forming the structure of FIG. 4F, 4G, or 4H.

Referring to FIGS. 4E and 4F, in an embodiment, a sixteenth plate 400f, in which solder balls 461, 462, 463, 464, 465, and 466 are coupled to pads 4511, 4521, 4531, 4541, 4551, and 4561 of the circuit layer 450, may be formed.

Referring to FIGS. 4F and 4G, in an embodiment, a circuit board 470 may be coupled to the sixteenth plate 400f, and a seventeenth plate 400g, in which the lower plate 402 and the middle plate 403 are separated from the sixteenth plate 400f, may be formed. The circuit board 470 may be similar to or the same as the circuit board 370 described with reference to FIGS. 3F and 3G, and a detailed description thereof will be omitted. The circuit board 470 may be fed to the sixteenth plate 400f such that a plurality of lands 4731, 4732, 4733, 4734, 4735, and 4736 are arranged in solder balls 461, 462, 463, 464, 465, and 466, and the solder balls 461, 462, 463, 464, 465, and 466 may be fused to the plurality of lands 4731, 4732, 4733, 4734, 4735, and 4736. One or more elements 472 disposed in the circuit board 470 may be electrically connected to the micro LED chips 431, 432, and 433 through the solder balls 461, 462, 463, 464, 465, and 466 and the circuit layer 450.

In some embodiments, referring to FIGS. 4E and 4H, an eighteenth plate 400h, in which a plurality of elements 481, 482, and 483 may be coupled to the circuit layer 450 of the fifteenth plate 400e and the lower plate 402 and the middle plate 403 are separated from the fifteenth plate 400e, may be formed. The structure, in which the plurality of elements 481, 482, and 483 are coupled to the circuit layer 450, is similar to or the same as the structure described with reference to FIGS. 3E and 3H, and a detailed description thereof will be omitted.

The display, for example, may be defined by one of the seventeenth plate 400g of FIG. 4G or the eighteenth plate 300h of FIG. 4H.

In some embodiments, the display may be defined by a structure, in which the lower plate 402 and the middle plate 403 are separated from the fourteenth plate 400d of FIG. 4D, the fifteenth plate 4002 of FIG. 4E, or the sixteenth plate 400f of FIG. 4F.

Figure 5:
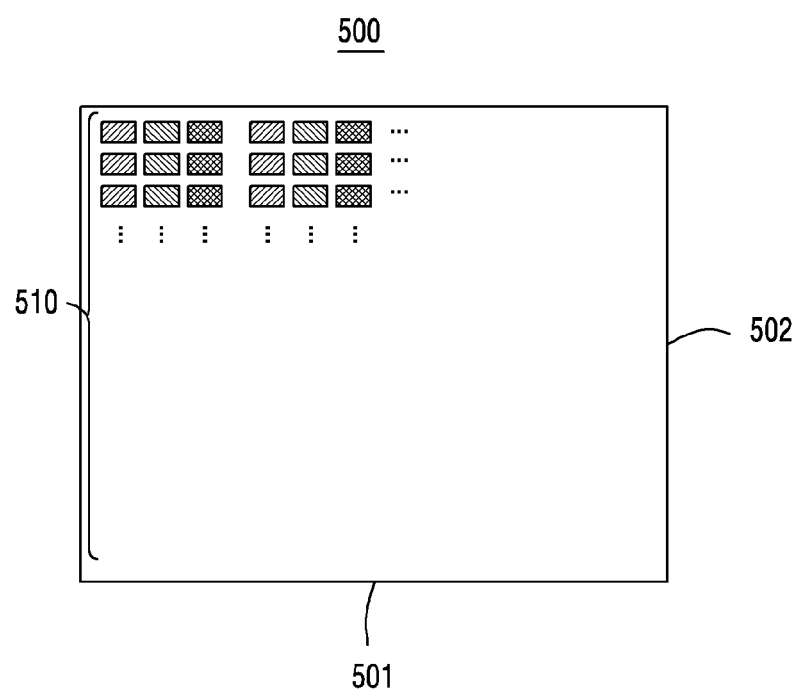
FIG. 5 is a plan view of a display according to an embodiment.

FIG. 5 is a plan view of a display according to an embodiment.

Referring to FIG. 5, in an embodiment, a display 500 may be a rectangular panel having a width 501 and a depth 502. The display 500 may include a plurality of micro LED chips 510 arranged according to the process flow of FIG. 2, and the plurality of micro LED chips 510 may define pixels. The size of the width 501 or the depth 502 of the display 500 may be various according to the sizes, the arrangements, the structures, and the like of the micro LED chips 510. For example, the display 500 may be designed to have a size that occupies the entire screen of the corresponding device. In some embodiments, the screen of the corresponding device may be divided into a plurality of areas, and the display 500 may be designed to have sizes that occupy the areas.

According to an embodiment of the disclosure, a display may include a first layer (e.g., the second plate 300b of FIG. 3B or the upper plate 401 of FIG. 4B) that is light-transmitting and includes a plurality of cavities (e.g., 320 of FIG. 3B or 420 of FIG. 4B), a plurality of light-emitting diodes (LED) chips (e.g., the micro LED chips 331, 332, and 333 of FIG. 3C or the micro LED chips 431, 432, and 433 of FIG. 4C) disposed in the cavities, and a second layer (e.g., the circuit layer 350 of FIG. 3E or the circuit layer 450 of FIG. 4E) including a circuit electrically connected to the plurality of LED chips. According to an embodiment, the cavities may have a volume of substantially not more than 200×200×200 μm³, by which the LED chips are accommodated therein.

According to an embodiment of the disclosure, at least one of the width, the depth, and the height of the LED chip may be not more than 100 μm.

According to an embodiment of the disclosure, the first layer may have a coefficient of thermal expansion that is substantially not more than $10 \times 10^{-6}$ m/m° C.

According to an embodiment of the disclosure, the first layer may include glass.

According to an embodiment of the disclosure, the cavities include grooves or recesses (e.g., 320 of FIG. 3B) disposed in the first layer.

According to an embodiment of the disclosure, the cavities may include holes (e.g., 420 of FIG. 4B) disposed in the first layer.

According to an embodiment of the disclosure, the display may further include a third layer (e.g., the resin layer 340 of FIG. 3D or the resin layer 450 of FIG. 4D) that is electrically insulating and disposed between the first layer and the second layer.

According to an embodiment of the disclosure, the display may further include a bonding material (e.g., the material coated on the bottom surfaces 321d, 322d, and 323d of FIG. 3C or the bottom surfaces 421d, 422d, and 423d of FIG. 4C) disposed between inner surfaces of the plurality of cavities and the plurality of LED chips.

According to an embodiment of the disclosure, the display may further include a conductive material (e.g., the solder balls 361, 362, 363, 364, 365, and 366 of FIG. 3F or the solder balls 461, 462, 463, 464, 465, and 466 of FIG. 4F coupled to the second layer and electrically connected to the circuit.

According to an embodiment of the disclosure, the display may further include one or more LED driving elements electrically connected to the circuit.

According to an embodiment of the disclosure, the one or more LED driving elements (e.g., 381, 382, and 383 of FIG. 3H or 481, 482, and 483 of FIG. 4H) are coupled to the second layer.

According to an embodiment of the disclosure, the display may further include a circuit board (e.g., 370 of FIG. 3G or 470 of FIG. 4G) including the one or more LED driving elements, and the second layer may be disposed between the first layer and the circuit board.

According to an embodiment of the disclosure, the display may further include a conductive material (e.g., solder balls) disposed between the second layer and the circuit board and electrically connecting the circuit and the circuit board. According to another embodiment, the display may further include a flexible conductive member having a length extending from a first end connected to the second layer and a second end connected to the circuit board.

According to an embodiment of the disclosure, the second layer may include a thin film transistor (TFT).

According to an embodiment of the disclosure, the plurality of LED chips may have different sizes or volumes.

According to an embodiment of the disclosure, the plurality of cavities may have different volumes.

According to an embodiment of the disclosure, the plurality of cavities may have a space having a rectangular cross-section.

According to an embodiment of the disclosure, a method for manufacturing a display may include forming a first layer that is light-transmitting and including a plurality of cavities having a volume of substantially not more than 200×200×200 µm$^3$, disposing a plurality of light-emitting diode (LED) chips having the volume of not more than the volume of the plurality of cavities, and forming a second layer including a circuit electrically connected to the plurality of LED chips.

According to an embodiment of the disclosure, the first layer may be a light-transmitting material have a coefficient of thermal expansion that is substantially not more than 10×10$^{-6}$ m/m° C.

According to an embodiment of the disclosure, the method may further include before forming the second layer, fixing the plurality of LED chips in the plurality of cavities by coating an electrically insulating bonding material on the first layer.

According to an embodiment of the disclosure, the method may further include mounting at least one LED driving element on one surface of the second layer.

The disclosure has been described above by way of exemplary embodiments. Those skilled in the art will appreciate that various modifications and changes may be made without departing from the essential scope and spirit of the disclosure. Therefore, the embodiments disclosed herein should be considered not from limitative viewpoints but from illustrative viewpoints. The scope of the disclosure should be determined not by the above description but by the appended claims, and all differences equivalent to the claims shall be construed as falling within the scope of the disclosure.

What is claimed is:

1. A display comprising:
    a first layer that is light-transmitting and comprises a plurality of cavities;
    a plurality of light-emitting diode (LED) chips disposed in the cavities; and
    a second layer comprising a thin film transistor (TFT) electrically connected to at least one of the plurality of LED chips.

2. The display of claim 1, wherein the cavities have a volume of substantially not more than 200×200×200 µm$^3$.

3. The display of claim 1, wherein the first layer has a coefficient of thermal expansion that is substantially not more than 10×10$^{-6}$ m/m° C.

4. The display of claim 1, wherein the first layer comprises glass.

5. The display of claim 1, wherein the cavities comprise grooves or recesses, or holes disposed in the first layer.

6. The display of claim 1, further comprising: a third layer that is electrically insulating and disposed between the first layer and the second layer.

7. The display of claim 1, further comprising: a bonding material disposed between inner surfaces of the plurality of cavities and the plurality of LED chips.

8. The display of claim 1, further comprising: one or more LED driving elements electrically connected to the TFT.

9. The display of claim 8, wherein the one or more LED driving elements are coupled to the second layer.

10. The display of claim 8, further comprising:
    a circuit board comprising the one or more LED driving elements,
    wherein the second layer is disposed between the first layer and the circuit board.

11. The display of claim 10, further comprising:
    a conductive material disposed between the second layer and the circuit board and electrically connecting the TFT and the circuit board; or
    a flexible conductive member having a first end connected to the second layer and a second end connected to the circuit board.

12. An electronic device comprising the display of claim 1.

13. A method for manufacturing a display, the method comprising:
    forming a first layer that is light-transmitting and comprising a plurality of cavities;
    disposing a plurality of light-emitting diode (LED) chips in the plurality of cavities; and
    forming a second layer comprising a thin film transistor (TFT) electrically connected to at least one of the plurality of LED chips.

14. The method of claim 13, wherein the first layer is formed of a light-transmitting material and has a coefficient of thermal expansion that is substantially not more than 10×10$^{-6}$ m/m° C.

15. The method of claim 13, further comprising: before forming the second layer, fixing the plurality of LED chips in the plurality of cavities by coating an electrically insulating bonding material on the first layer.

* * * * *